United States Patent [19]

Borras et al.

[11] Patent Number: 4,490,688

[45] Date of Patent: Dec. 25, 1984

[54] DIGITAL AND ANALOG PHASE DETECTOR FOR A FREQUENCY SYNTHESIZER

[75] Inventors: Jaime A. Borras, Hialeah; Jose I. Suarez, Miami; Alan M. Victor, Cooper City, all of Fla.

[73] Assignee: Motorola, Inc., Schaumburg, Ill.

[21] Appl. No.: 251,570

[22] Filed: Apr. 6, 1981

[51] Int. Cl.³ .............................................. H03L 7/12
[52] U.S. Cl. ...................... 331/1 A; 331/4; 331/17; 331/27; 328/134; 328/155
[58] Field of Search .................... 331/10, 11, 12, 1 A, 331/4, 17, 25–28; 328/133, 134, 140, 141, 155

[56] References Cited

U.S. PATENT DOCUMENTS 3,795,870 3/1974 Sanders ............................ 331/11 X
3,826,988 7/1974 Wise et al. ......................... 328/133

OTHER PUBLICATIONS

Motorola MX300 Series "Handie-Talkie" FM Two-Way Portable Radios Theory/Maintenance Manual.

*Primary Examiner*—Siegfried H. Grimm
*Attorney, Agent, or Firm*—Joseph T. Downey; Donald B. Southard; Edward M. Roney

[57] ABSTRACT

A sample and hold phase detector for a phase locked loop includes a digital detector for detecting the frequency and phase difference between the reference signal and the voltage controlled oscillator (VCO) signal. In a first mode of operation, the digital detector generates a first signal relating the difference in frequency and in a second mode of operation generates a second signal relating the difference in phase. A capacitor stores the first or second signal depending on the operational mode of the digital detector. The capacitor is selectively discharged in response to a discharge signal produced by the digital detector when either the VCO frequency is higher than the reference frequency or following each detection of a phase difference. A first amplifier is used to bypass a portion of the loop filter to effect rapid changes in VCO frequency in the first mode while a second amplifier couples the control voltage to the VCO via the loop filter to maintain proper VCO frequency in the second mode.

5 Claims, 11 Drawing Figures

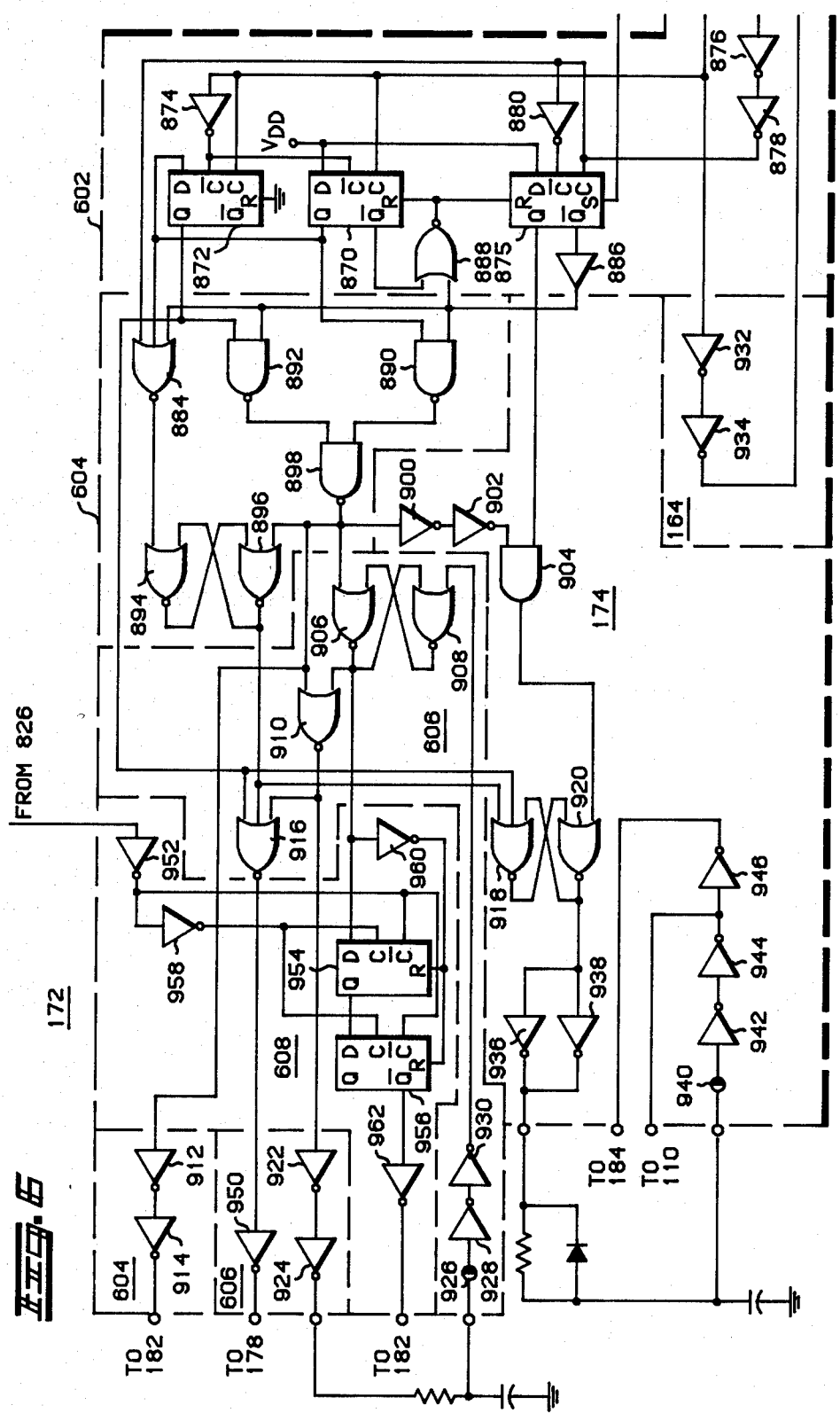

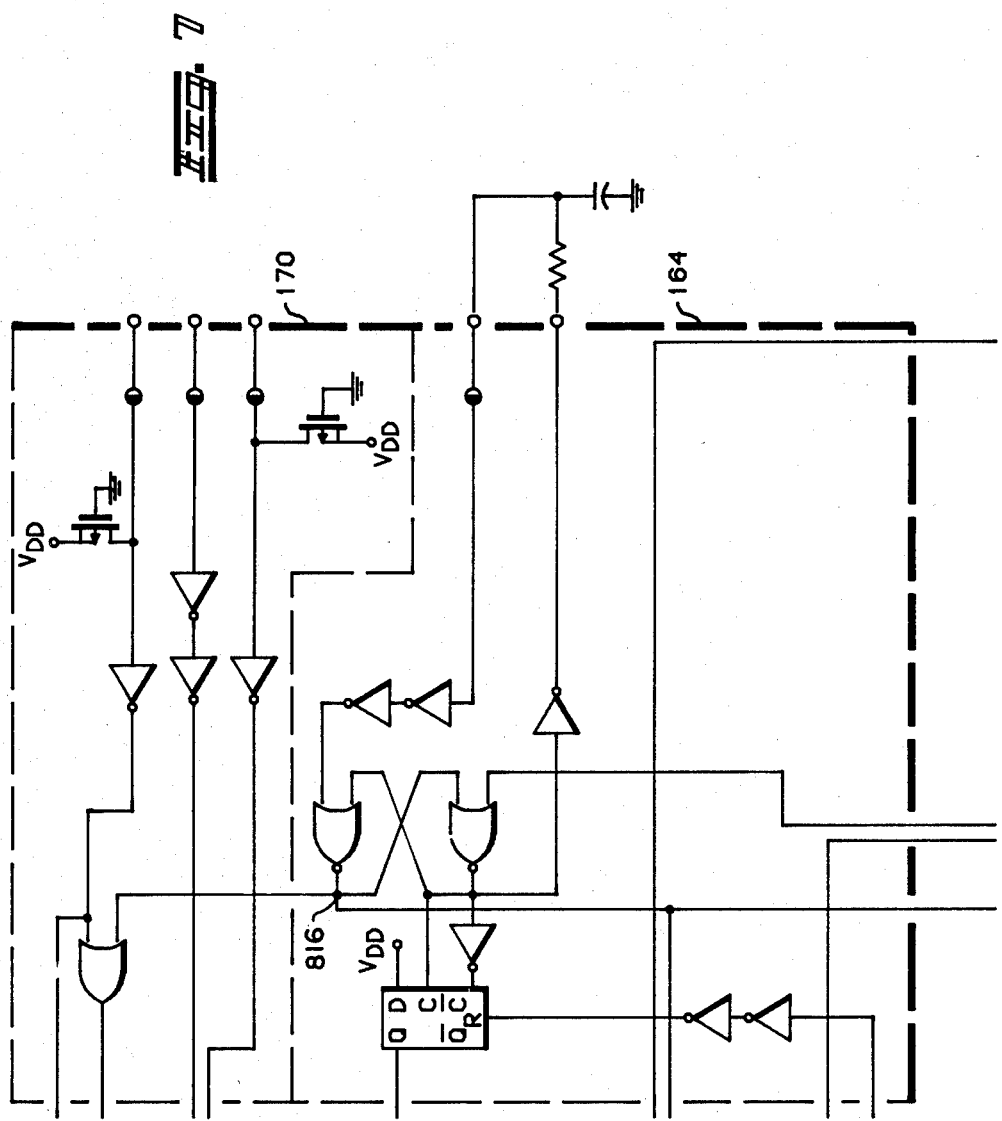

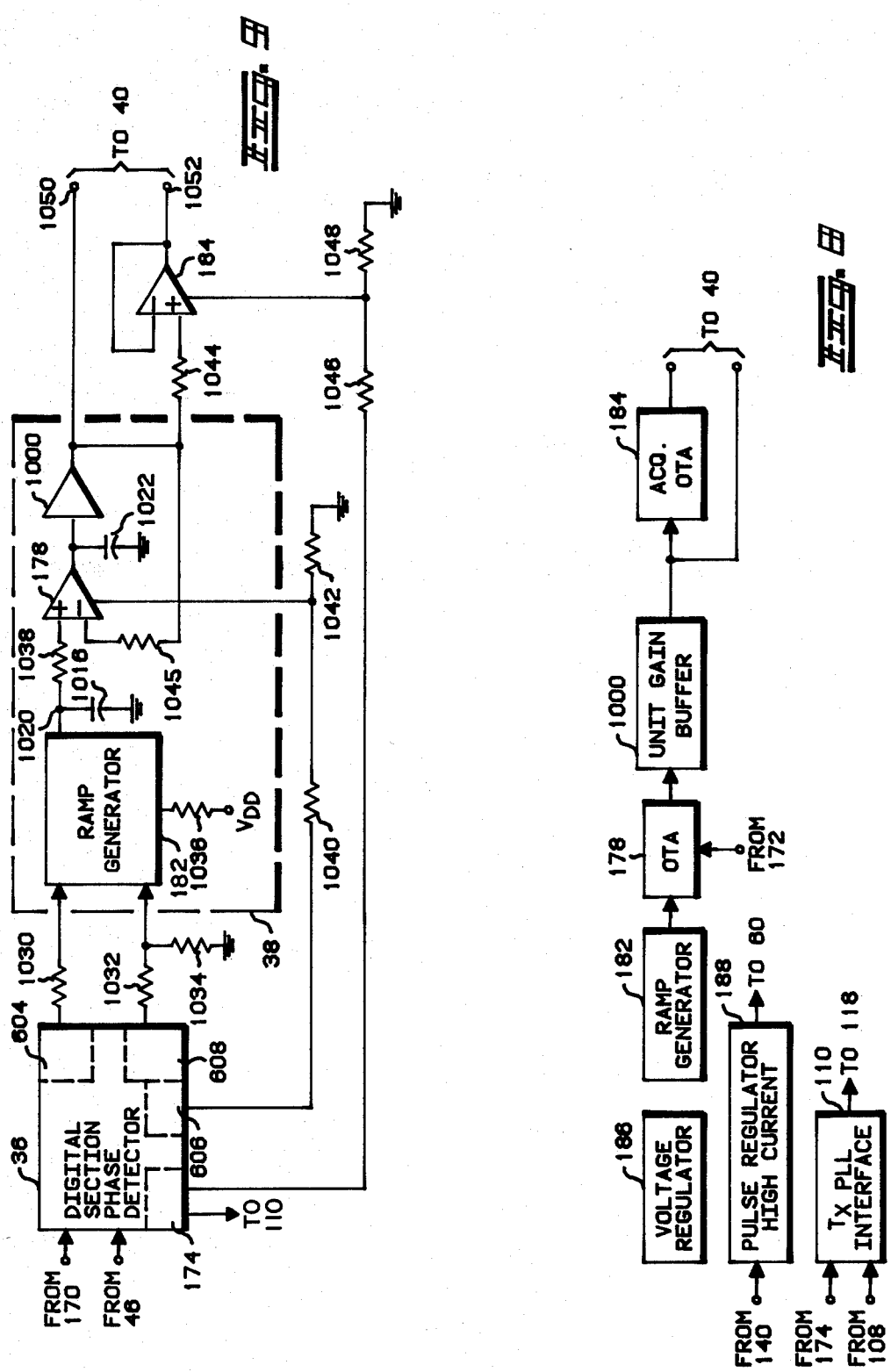

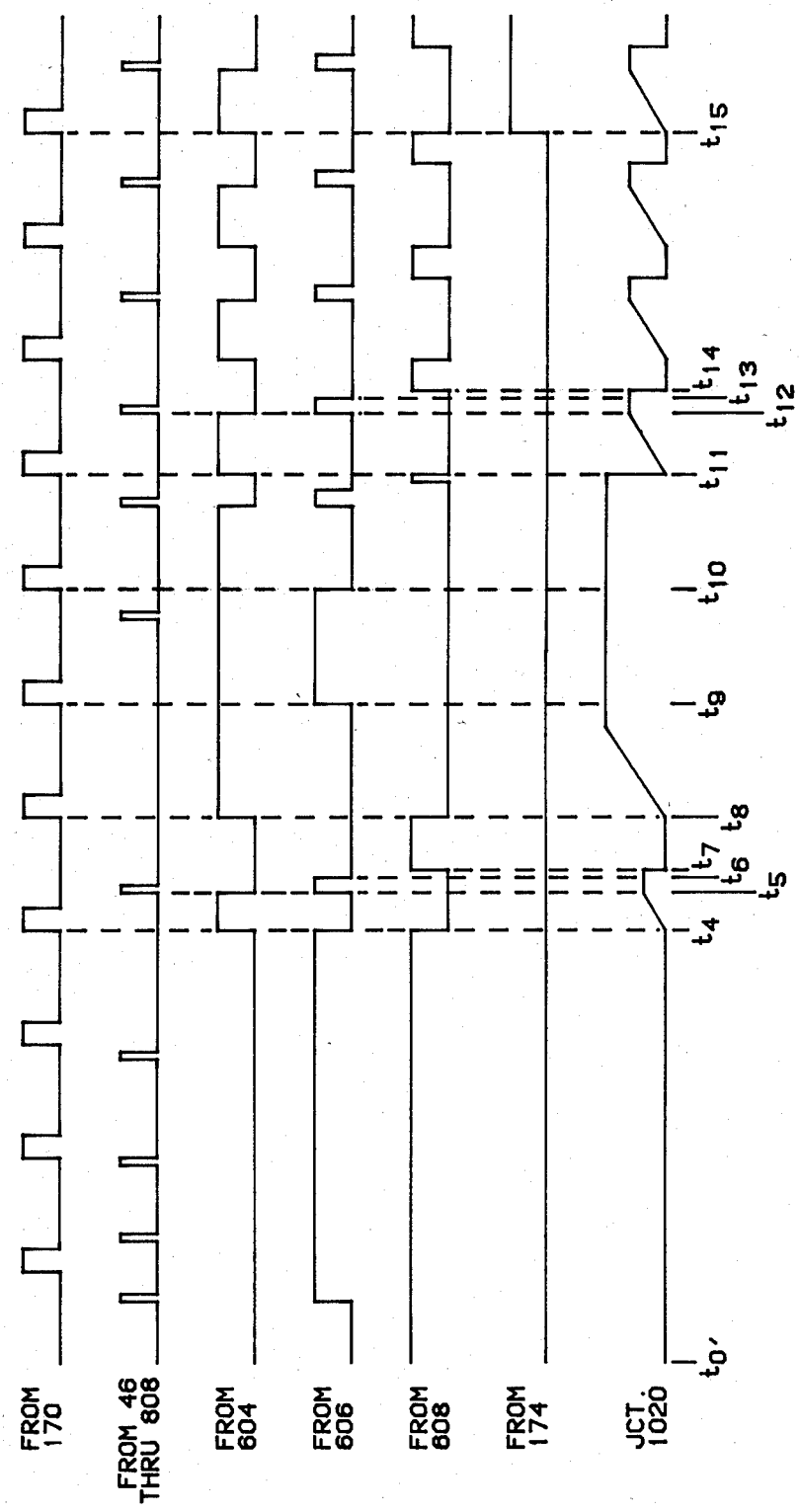

DIGITAL AND ANALOG PHASE DETECTOR FOR A FREQUENCY SYNTHESIZER

BACKGROUND OF THE INVENTION

1. Field of the Invention

This invention relates generally to the field of frequency synthesizer systems and more particularly to such systems for use in communication transceivers. It further relates to a zone switching system for synthesized transceivers.

2. Description of the Prior Art

It is recognized that for many years there has been an ever increasing demand for FM two-way portable radios. This stems from the increasing use of portable radio communications in business, industry and government. The level of sophistication of the communication networks utilized by various institutions has constantly risen and many networks utilize some frequencies for local communications and other frequencies for longer range communications to a central location.

With the increasing use by many institutions of more sophisticated communications systems has come the demand for the capability of the portable transceivers to operate over a much larger number of frequencies. The majority of two-way FM portable radios currently in use today are those which employ conventional crystal controlled frequency channel elements. Thus, as each portable radio is required to either transmit or receive on more than one frequency an additional crystal controlled channel element must be included and electrically actuated so that both transmission and/or reception can occur.

As is the case with the several networks or systems, many different frequency combinations are grouped into communication channels from the available frequencies within a given area. Thus, any portable transceiver customer must specify to the manufacturer the desired pairs of receive and transmit frequencies for the several communication channels which are required in portable transceivers for a selected area. With such an order, the corresponding crystals to enable two-way communication on those channels must be manufactured and inserted into the transceiver. Frequently, design modifications must be made to accomodate the additional channel elements resulting in an increased size and weight of unit and a greatly increased cost.

The required long lead time for the manufacture of multifrequency transceivers to meet the market demand has caused a general trend toward the use of frequency synthesis in the design of FM two-way portable radios. A high order of accuracy of frequency control for a transceiver may be achieved by crystal control of the conversion oscillator. However, the multiple-frequency operation of the transceiver would call for a large number of crystals which is especially true where the transmit and receive frequencies are not identical. This difficulty may be reduced for certain frequency combinations by the use of a switched crystal frequency generator, a device in which the harmonics and subharmonics of one or more oscillators are mixed to provide a multiplicity of output frequencies. All of the resulting output frequencies are harmonically related to a subharmonic of the one or more master oscillators. The combination of a master oscillator signal with a secondary signal in a suitable mixer can provide the choice of a number of controlled frequencies. This reduces the number of crystals necessary to achieve several controlled frequencies.

However, there remains the difficulty of having only a restricted set of possible frequency combinations, whereas the customer may require unique combinations for his communication network. If a stable variable-frequency oscillator is substituted for a fixed crystal oscillator and a digital frequency synthesis technique is employed, a virtually unlimited number of discrete frequencies directly related to the frequency of the master oscillator are available. Instead of providing a plurality of individual channel elements suitable for each individual user's purpose, a manufacturer can provide one or more crystal controlled oscillators and a programmable memory which can be modified at the factory to conform to an individual user's required frequencies. This enables a manufacturer to assemble virtually all of his transceiver units in the same way and near the last step in the manufacturing process insert the memory programmed to the individual user's frequency requirements.

As will be described in greater detail, the programmable memory provides a series of numerical divisors which modify an output signal from a voltage controlled oscillator to cause tuning to any of a number of various frequencies. The use of digital frequency synthesizers is known in the art of radio transmitters and receivers but it has only recently been incorporated into the operation for two-way portable radios.

One of the basic problems with the use of frequency synthesized portable radios is the limited power available for the portable hand-held units. Thus, any frequency synthesis system must not be wasteful of the limited battery capacity available in the portable units. In addition, it has been found that various design implementations of digital frequency synthesizers do not meet the rigid specifications which are applied to radios which employ crystal controlled channel elements. It is well recognized in the art that crystal controlled channel elements produce extremely well defined frequencies. Digital frequency synthesizers can provide the same degree of accurate tuning as can the crystal controlled channel elements. But, the replacement of crystal controlled channel elements by a frequency synthesis system might ordinarily result in some degradation in the performance specification as, for example, adjacent channel selectivity.

The problem is therefore to find a digital frequency synthesized transceiver system for portable transceivers which will provide the size reduction, cost efficiency, power conservation and programmability that a multitude of users require yet can stay within the rigid performance specifications that apply to the use of crystal controlled elements.

Although too general and therefore not suitable to solve the problem, a block diagram of a known digital frequency synthesizer is shown in FIG. 1. A basic element of frequency synthesis systems is the phase-lock loop circuit in which the output of a voltage-controlled oscillator (VCO) is constantly compared with the frequency of the master crystal oscillator. Any unwanted change or drift in frequency of the variable controlled oscillator with respect to the master oscillator is detected by the phase comparator. When such a phase difference exists, the phase detector generates a control voltage which returns the VCO to the correct frequency.

Normally, the output signal of the master crystal oscillator is applied to a frequency divider that divides that signal by a fixed integer M and provides a square-wave output reference signal at 1/Mth the frequency of the master oscillator. Similarly, the output signal of the voltage-controlled oscillator is divided by a variable divider which produces a signal at 1/Nth the frequency of the VCO. This signal is compared with a reference signal which may be a square wave from the fixed M divider in a phase comparator. Any phase difference is detected and applied through an integrating circuit and a low-pass filter to the voltage-controlled oscillator. This phase difference signal, after being processed and filtered provides a DC control voltage that is highest when the phase difference is greatest. When the signals are equal and in phase in the comparator, the loop is said to be "locked."

The output frequency of the synthesizer can be changed by varying the divide ratio of the variable divider N. When a new frequency is within the capture range of the phase-locked loop, the control voltage will change to bring the frequency of the VCO to the new value demanded by the setting of the variable divider. If a new frequency is outside the capture range of the circuit, the VCO will be swept through its entire operating range, and as the VCO frequency then enters the capture range of the phase-locked loop, the loop will take over frequency control and lock on the desired frequency.

SUMMARY OF THE INVENTION

It is an object of the present invention to provide a digital and analog phase detector for a frequency synthesizer.

It is another object of the present invention to provide a phase detector which is capable of rapid frequency adjustment.

A phase detector for the phase locked loop portion of a frequency synthesizer in which a detector receives a reference frequency signal and a voltage controlled oscillator signal. The phase detector includes both digital and analog portions and is coupled through a loop filter to the voltage controlled oscillator, and comprises means for detecting both the frequency and phase difference between the reference signal and the voltage controlled oscillator signal. The phase detector produces a first control signal when said reference and oscillator signals are not at the same frequency and a second control signal proportional to the phase difference between the reference and oscillator signals when at the same frequency. Means responsive to the second control signal are coupled to the loop filter for maintaining the voltage controlled oscillator at a desired tuning position. Current amplifier means are coupled to the detecting means and are responsive to the first control signal for bypassing a portion of the loop filter to supply voltage to the voltage controlled oscillator to produce rapid tuning to the correct frequency.

BRIEF DESCRIPTION OF THE DRAWINGS

FIG. 6 shows a detailed electrical schematic for digital detector 172.

FIG. 7 shows a detailed electrical schematic for delay circuit 164.

FIG. 8 shows a functional block diagram of the analog portion of the frequency synthesis system of the present invention.

FIG. 9 is a combined block diagram and electrical schematic of the digital and analog sample and hold circuit of the frequency synthesizer.

FIG. 10 shows a diagram of waveforms for the sample and hold circuit of the frequency synthesizer.

DESCRIPTION OF THE PREFERRED EMBODIMENT

Figure 2:
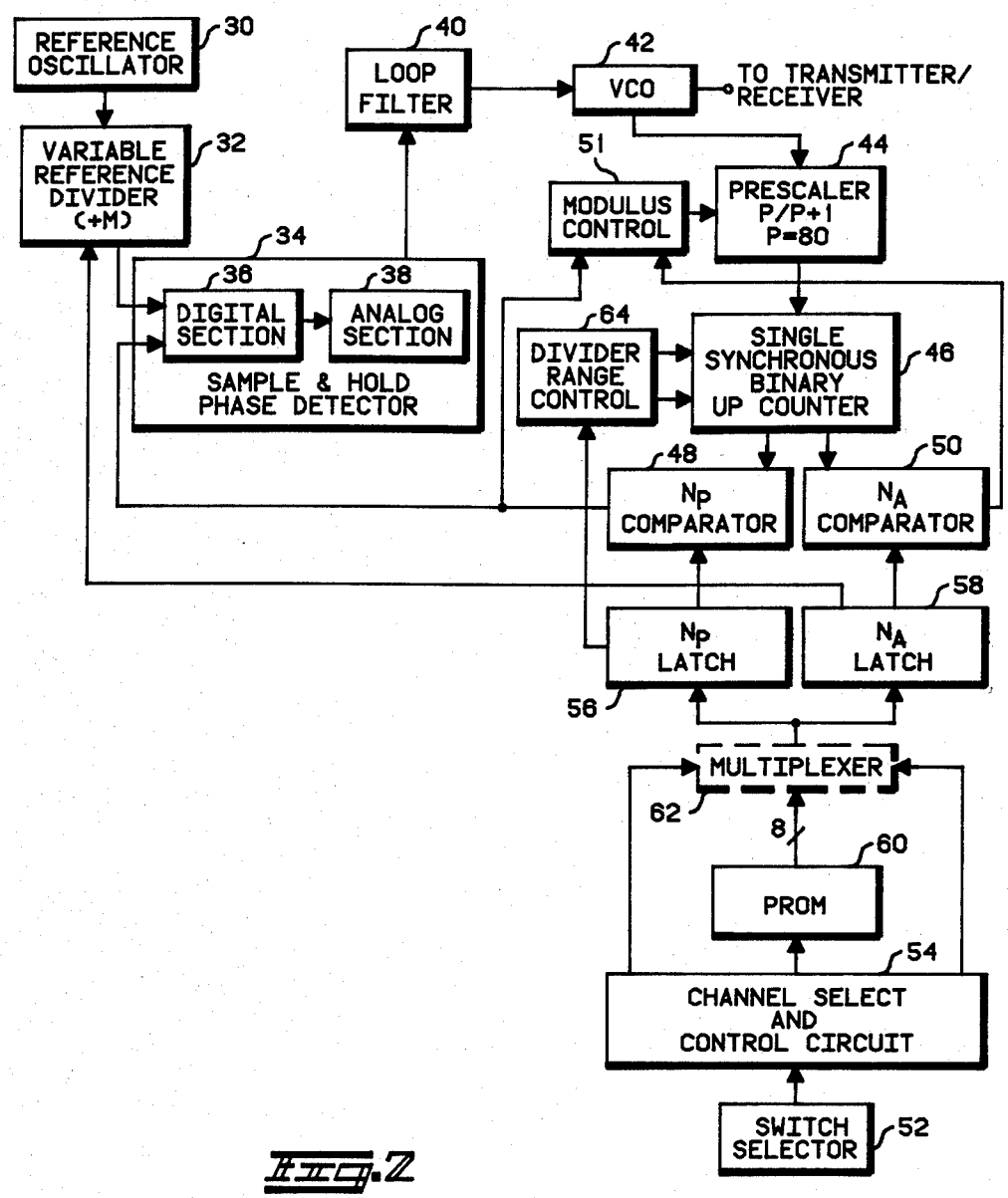
FIG. 2 is a functional block diagram of the digital frequency synthesizer system for the present invention.

FIG. 2 is a functional block diagram of the digital frequency synthesizer of the present invention. A reference oscillator 30 supplies an output signal to a variable reference divider 32 which is coupled to a sample and hold phase detector 34. Sample and hold phase detector 34 is shown to include a digital section 36 and an analog section 38. The output of phase detector 34 is supplied to a loop filter 40. Loop filter 40 is connected to a voltage controlled oscillator 42 which has a first output coupled to either a transmitter or a receiver and a second output coupled to a prescaler circuit 44. The output of prescaler circuit 44 is supplied to a synchronous binary up counter 46. Two signal outputs of counter 46 are applied to an $N_P$ comparator 48 and an $N_A$ comparator 50. An output of $N_P$ comparator 48 and an output of $N_A$ comparator 50 are coupled to a modulus control circuit 51. The output of modulus control circuit 51 is coupled to prescaler 44. The output of $N_P$ comparator 48 is also coupled to digital section 36 of phase detector 34.

A frequency switch selector 52 is coupled to a channel select and control circuit 54 which supplies signals to an $N_P$ latch circuit 56 and an $N_A$ latch circuit 58. An output of channel selected control circuit 54 is also supplied to a programmable read-only memory PROM 60. The output of PROM 60 is coupled to a multiplexer 62 shown in phantom which in response to enable signals from channel select and control circuit 54 alternately supplies information to $N_P$ latch 56 and $N_A$ latch 58. Multiplexer 62 is not a physical device but rather represents the operation of transferring information from PROM 60 to the latches. $N_P$ latch 56 is coupled to a range divider control 64 which is coupled to synchronous binary counter 46. $N_P$ latch 56 is also coupled to $N_P$ comparator 48. An output from $N_A$ latch 58 is coupled to variable reference divider 32. $N_A$ latch 58 is also coupled to $N_A$ comparator 50.

In normal operation, switch selector 52 is actuated by the portable transceiver operator to select a desired communication channel and supplies information to channel select and control circuit 54 which in turn accesses PROM 60 to address a specific location which contains the $N_A$ and $N_P$ numerical divisors in their binary number configurations. The binary number configurations of the two divisors are supplied through multiplexer 62 and loaded into the appropriate $N_P$ latch 56 and $N_A$ latch 58. The purpose of the latches is to allow the information for subsequent comparisons to be available so that comparisons can be made at any time during the sampling operation even though power to the programmable read-only memory is terminated to reduce battery drain.

Figure 1:
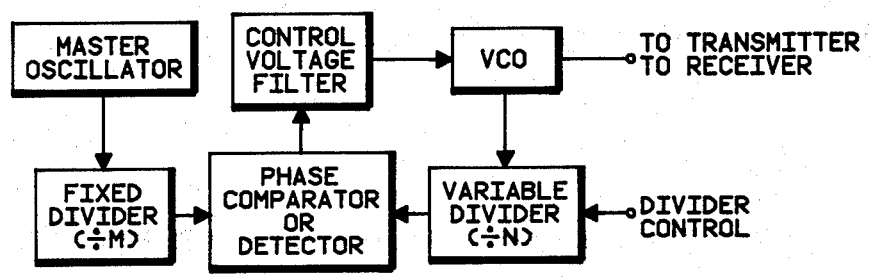
FIG. 1 is a functional block diagram of a prior art digital frequency synthesizer system.

In a manner which is quite similar to the description for the digital frequency synthesizer shown in FIG. 1, reference oscillator 30 supplies a stable fixed frequency signal to variable reference divider 32. A portion of the binary configuration of the $N_A$ numerical divider as stored in $N_A$ latch 58 is supplied to variable reference divider 32 to establish the desired channel spacing for the portable transceiver. The sample and hold phase detector operates in both a digital and analog manner to provide a fast response and precise phase comparison for the loop operation. The output of phase detector 34 is supplied through a loop filter to the voltage controlled oscillator 42. The voltage control oscillator 42 is coupled in a normal manner alternatively to the transmitter or receiver to cause tuning of the transceiver and is also supplied to prescaler circuit 44. A portion of the binary configuration for numerical divisor $N_P$ as stored in $N_P$ latch 56 is utilized by divider range control circuit 64 and synchronous binary counter 46 to enable counting in the correct range for the desired tuning.

An output of $N_A$ comparator 50 is supplied to modulus control 51 and then to prescaler 44 to control the selection of the modulus for the prescaler opration. The prescaler begins its operation at one modulus and when the $N_A$ comparator indicates that a comparison has been reached, the modulus is then changed to another integer value. This change in cooperation with divider range control 64, allows the single synchronous binary counter 46 to correctly determine the frequency and supply appropriate signals to $N_A$ comparator 50 and $N_P$ comparator 48. While the operation of the $N_A$ comparator serves principally to change the prescaler modulus value at a crucial time, the operation of the $N_P$ comparator is fed back through the digital section 36 of the phase detector 34 and provides completion of the phase lock loop circuit. As will be described in more detail later, the combination of the $N_A$ and $N_P$ comparators along with the divider range control and the selectable prescaler allow the operation of a single synchronous counter to provide all of the division ratios necessary in the phase locked loop to achieve correct tuning.

Normally, the synchronous binary counting would be done with two separate binary down counters, and the predetermined numbers would be loaded into each to determine when change of the modulus of the prescaler should occur so that the digital analysis of the incoming signal could be completed to determine frequency correspondence within the phase locked loop circuit. However, in one aspect of the present invention the system is designed to operate with a single synchronous binary counter to achieve all of the necessary counting and dividing functions for precise synthesis of the desired frequencies.

The phase locked loop circuit of the present invention compares a divided down reference frequency from stable reference oscillator 30 to a sub-multiple of the voltage controlled oscillator frequency and makes corrections to VCO 42 in order to force the frequencies to be equal. The variable reference divider ratio is derived from information contained in the binary equivalent of the $N_A$ numerical divisor as loaded in $N_A$ latch 58. The function of prescaler 44, synchronous counter 46, range divider control 64 and comparators 48 and 50 are to provide a "divide by a variable number" function which may be called $N_T$. For tuning, the M divider ratio is programmed to correspond to the appropriate reference frequency, and $N_T$ is varied in order to move the voltage controlled output frequency in increments equal to the reference frequency. The reference value may be determined by considering both the minimum channel spacing and the transceiver multiplier.

The tuning is achieved by programming the appropriate reference frequency through a chain of dividers which may be summed up as dividing by an integer M. Once the reference frequency is established, the phase detector circuit compares the reference frequency to a sub-multiple of the VCO frequency. As will be described in greater detail later, sample and hold phase detector 34 operates much like a standard phase detector when the reference and VCO submultiple signals are not at the same frequency. However, a distinguishing phase mode of operation is established when the reference and the VCO submultiple signals are at the same frequency and the reference signal is leading in phase. Digitally this corresponds to a condition in which the variable VCO pulse is interleaved in one period of the reference pulse. A voltage proportioned to the phase difference between these signals is applied to loop filter 40 to steer VCO 42 and thus correct for any variations in the VCO frequency. For the dual modulus prescaler, the VCO output frequency is divided down by first P plus one and then P. For every P plus one pulse entering the programmable counter, both the $N_A$ count and the $N_P$ count are incremented by one. The dual modulus prescaler divides by P plus one until the count reaches the $N_A$ program state, then the modulus of prescaler 44 is changed to P. The prescaler divides by P a total of $N_{P-NA}$ pulses until the $N_P$ program stage is achieved. Once the $N_P$ count is detected, the system resets and the cycle repeats by operating through modulus control 51.

To understand the operation of the frequency synthesizer and its dividing relationship for various frequencies, it is convenient to consider an example so that the various elements of the system may be understood completely at the outset. The preferred embodiment for the present invention includes the digital frequency synthesizer modifying a standard transceiver. An example of such a standard transceiver is one manufactured by Motorola and designated as MX-300. There are several models of the MX300 which may be characterized by their range of operating frequencies. For example, there are VHF, UHF and 800 MHZ models which can operate only within each designated frequency range. A feature of the Motorola MX300 VHF system which must be described is that in receive mode the receiver portion of the circuit includes a frequency doubler, that is, the frequency from the voltage control oscillator is doubled prior to injection. In addition, for the transmit mode, the phase locked loop itself includes a multiplication factor of three so that the VCO frequency is tripled before injection. The operation of the phase locked loop transmitter system of the preferred embodiment is described in U.S. Pat. No. 3,958,186 to Jesse et al., and assigned to the assignee of the present invention which is hereby incorporated by reference. Thus, the transceiver system embodiment has different multiplication factors for both transmit and receive modes.

It is most convenient to consider the operation in the receive mode. For simplicity, the VHF band is selected and encompasses frequencies in the range of 136-174 MHz. A common spacing specified by the FCC or equivalent foreign communication agencies would be a multiple of either 5 kHz or 6.25 kHz for the various communication channels. Choosing the 5 kHz spacing, any frequency channel which satisfies the relationship 136 MHz+some multiple times 5 kHz may be tuned. The spacing corresponds to an output frequency of variable reference divider 32 of 2.5 kHz.

It has been found convenient to use a standard 3.6 MHz crystal for reference oscillator 30 and to produce the 5 kHz spacing, variable reference divider 32 must divide down by a ratio equal 1,400. The simple calculation will confirm that 3.6 MHz divided by 1,440 equals 2.5 kHz and when one includes the doubling factor present in the MX300 series receiver this corresponds to the specified 5 kHz smallest increment of frequency change. Therefore, the divide by M operation of variable reference divider 32 would correspond to division by 1,440. As will be recalled, for the description of FIG. 1, the M divider ratio is normally fixed and generally the second divider ratio which in the case of the present embodiment will be referred to as $N_T$ is varied in order to move the voltage control oscillator output frequency in 5 kHz increments. In the present invention the divide by M ratio is fully programmable.

The reference incremental frequency is determined by selecting minimum channel spacing and the output multiplier for the frequency to be synthesized. Knowing this divided down reference frequency, one can determine what the range of the total variable division must be for the end points of the total tuning frequency range. Thus, if one takes the low end point of the VHF region 136 MHz subtracting off the IF which, will be considered to be 21.4 MHz and dividing by the multiplier 2 the resulting voltage control oscillator frequency is 57.3 MHz. Similarly the high end point is 76.3 mHz.

To understand the total numerical division ratio necessary to achieve these end point frequencies, one takes the end point VCO frequencies and divides by 2.5 kHz which is the smallest incremental change that is provided by variable reference divider 32 and determines that the total numerical range of $N_T$ corresponding to the designated VHF range is from 22,920-30,520. Thus, if the voltage control oscillator frequency is divided by either of these two numbers and phase compared to the reference the receiver will be tuned to the end points of the VHF tuning region.

It is necessary to compute the $N_P$ and $N_A$ values so that they might be understood in conjunction with the total numerical divisor operating on the voltage control oscillator frequency in the phase locked loop. Because dual modulus counting is used, the equation which relates the $N_P$'s and $N_A$'s to the total $N_T$ as calculated is the following: $N_T=(N_P-N_A)\times P+N_A\times(P+1)$ where P is the value of the modulus of prescaler 44. This relationship using a dual modulus prescaler which in the case of the VHF region chosen operates at a division of either 81 or 80 for the prescaler operation, provides the counting relationship so that with a suitable combination of $N_P$'s and $N_A$'s the total division may be achieved to tune the voltage control oscillator to the appropriate frequency. While the mechanics of the precise operation of division to determine the integer and decimal equivalents of dual modulus counting need not be detailed here, it will be obvious to those skilled in the art that the total $N_T$ of 22,920 correspond to an $N_P$ of 286 and an $N_A$ of 40, while the larger total numerical divisor $N_T$ of 30,520 correspond to an $N_P$ of 381 and an $N_A$ of 40. The $N_P$ number may also contain in the most significant bit, information to specify the range of operation for the synthesize tuning to divider ranger control 64. The $2^7$ position of $N_P$ at 0 will indicate to the divider range control that the $N_P$ will lie in the range of 256-383, that is well within the required 286-381 range for tuning the required VHF frequencies. Thus, the binary configuration of $N_P$ need only contain the difference between the range low end point and the calculated $N_P$. The binary configurations of the required $N_P$'s and $N_A$'s with the most significant bit (MSB) on the left are:

| 256 to 383 | | $2^7$ | $2^6$ | $2^5$ | $2^4$ | $2^3$ | $2^2$ | $2^1$ | $2^0$ | |
|---|---|---|---|---|---|---|---|---|---|---|
| 286 − 256 = 30 | $N_P$: | 0 | 0 | 0 | 1 | 1 | 1 | 1 | 0 | $(30)_2$ |
| | $N_A$: | 0 | 0 | 1 | 0 | 1 | 0 | 0 | 0 | $(40)_2$; |
| 381 − 256 = 125 | $N_P$ | 0 | 1 | 1 | 1 | 1 | 1 | 0 | 1 | $(125)_2$ |
| | $N_A$: | 0 | 0 | 1 | 0 | 1 | 0 | 0 | 0 | $(40)_2$ |

Similarly, the highest order bit in the $N_A$ binary representation may be used to designate to the variable divider 32 a change in the value of M that may be required for the operation of different channel spacings. This is why a control line is shown in FIG. 2 connecting $N_A$ latch 58 and variable reference divider 32. However, in the case of the receive and transmit frequencies at the 5 kHz spacing it is the actuation of the push-to-talk (PTT) switch which resets the value of the M numerical to modify the reference frequency. It should be recalled that for the operation of a Motorola MX300 VHF transceiver which utilizes a multiplication factor of 3 in the transmit mode but a factor of two in the receive mode, the reference frequency of the synthesizer must be different in the two modes.

If, however, the system in which the device were to operate had different spacings for transmit and receive, then the highest order $N_A$ bit would be coded appropriately to indicate this and thereby change the divider ratio so that the correct tuning would be achieved. Similar examples could be worked out for both the UHF and 800 MHz bands for which there is a market demand. The modifications for such examples would include those directly attributable to the receiver embodiment as well as the customary transmission and reception frequencies for those bands.

Figure 3:
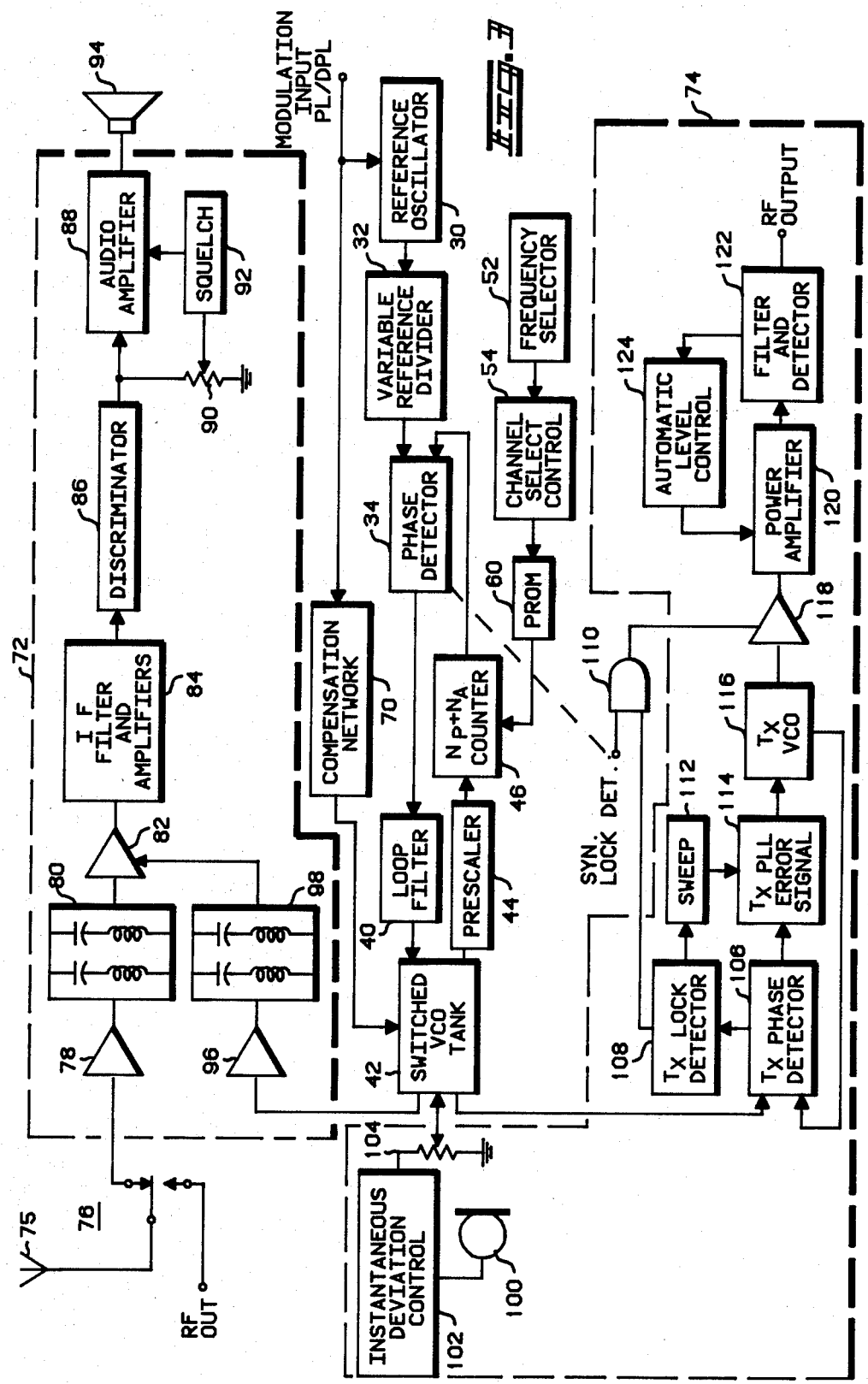
FIG. 3 is a functional block diagram of a VHF transceiver employing the present digital frequency synthesizer invention.

FIG. 3 is a functional block diagram of a complete VHF transceiver employing the present disclosed digital frequency synthesizer. Consistent with the description in FIG. 2, frequency selector 52 is coupled to channel select control 54 which is coupled to PROM 60 which supplies programmed information to $N_P$ and $N_A$ counter 46. The digital synthesizer employs reference oscillator 30 coupled through variable frequency divider 32 to phase detector 34 which also receives an input from counter 46. The output of phase detector 34 is coupled to loop filter 40 which is also coupled to VCO 42. VCO 42 is further described as a switched tank VCO. VCO 42 is connected through prescaler 44 to $N_P$ and $N_A$ counter 46. An input signal designated modulation input is applied to reference oscillator 30 and through a compensation network 70 to VCO 42. This collection of functional blocks represents the frequency synthesizer system more completely described in FIG. 2.

To understand the operation of the transceiver it is necessary to distinguish the separate receiver and transmitter sections functions with respect to the digital frequency synthesizer. FIG. 3 is segregated into two distinct circuit sections, each of which is enclosed by a broken line. In particular, the receiver section is designated 72 while the transmitter section is designated 74.

An antenna 75 is coupled through antenna switch 76 to an RF amplifier and filter 78 in receiver section 72. The output of amplifier 78 is coupled to a four pole filter 80 which is coupled to mixer 82. The output of mixer 82 is coupled to IF filter and amplifier 84 whose output is coupled to discriminator 86. The output of discriminator 86 is directly coupled to audio amplifier 88 and through potentiometer 90 to ground. A squelch control circuit 92 is connected to a variable tap of potentiometer 90 and to audio amplifier 88. The output of audio amplifier 88 is connected to a speaker 94. An output of VCO 42 from the frequency synthesizer section is coupled through a times two multiplier 96 and a three pole filter 98 to mixer 82.

For transmitter section 74, a microphone 100 is coupled through an instantaneous deviation control circut 102 to a potentiometer 104. The variable tap of potentiometer 104 is coupled to switch tank VCO 42. The second output of VCO 42 is coupled to a transmitter phase detector 106 to provide a synthesized reference frequency source for the transmitter phase locked loop. The output of transmitter phase detector 106 is coupled to a transmitter lock detector 108 which has a first output coupled to PLL interface gate 110 and a second output coupled to sweep control 112. The output of sweep control 112 is coupled to error signal circuit 114, which also receives an input directly from phase detector 106. The output of error signal circuit 114 is coupled to a transmitter VCO 116 which has a first output coupled back to phase detector 106. A second output of transmitter VCO 116 is coupled to RF gate 118. A signal from synthesizer phase detector 34 is applied to a second input of PLL interface gate 110.

The output of gate 110 is applied to a control input of RF gate 118. The output of RF gate 118 is coupled to a power amplifier 120 whose output is coupled to a filter and detector 122. The output of filter and detector 122 is coupled back through an automatic level control 124 to a control input of power amplifier 120. A second output of filter and detector 122 is designated RF output which is connected to the second terminal of antenna switch 76.

In operation, for the receiver section, antenna 75 provides a signal to RF amplifier 78 which both amplifies and filters it and supplies the amplified and filtered signal through four pole filters 80 to mixer 82. The output of the digital synthesizer controlled VCO 42 is coupled through a times two multiplier 96 and through a three pole filter 98 to mixer 82. In a standard method, the two signals are combined in the mixer using a superheterodyning technique to produce an intermediate frequency signal which is supplied through IF filter and amplifier 84 to a discriminator which detects carrier encoded information. The detected information is supplied to audio amplifier 88. In a manner consistent with normal operation squelch control 92, which has an adjustable threshold level is coupled to the audio amplifier. At the output of the audio amplifier is a standard speaker through which the decoded information is converted to an acoustical signal so that the transceiver operator may receive communications.

In a similar manner to prior radios, microphone 100 operates through the instantaneous deviation control 102 which is adjustable through potentiometer 104 to supply a signal which modulates voltage controlled oscillator 42 the output of which is supplied to transmitter circuitry 74. The modulated information is supplied to transmitter phase detector 106 which supplies information both to transmitter error signal detector 114 and transmitter lock detector 108. Lock detector 108 controls sweep control 112 which supplies its output to transmitter error signal 114. The output of transmitter error signal 114 is coupled to transmitter VCO 116 which also supplies a signal back to transmitter phase detector 106. The transmitter section operates to modulate the synthesizer VCO 42 through microphone 100 and IDC 102 and the resulting signal is supplied to the transmitter phase locked loop.

Transmitter PLL interface gate 110 ensures that no transmission can occur unless the frequency synthesizer is locked onto a fixed correct frequency. Thus, the phase lock loop interface circuit is disabled during the frequency selection operation of the digital frequency synthesizer but this gate is enabled when that frequency is locked.

In a normal manner, the RF gate 118 supplies the RF modulated information to power amplifier 120 and then to a filter and detector network which includes automatic level control 124. The output of the RF filter and detector circuit 122 is supplied to antenna switch 76 which, during transmit operation, would be disconnected from receiver circuitry 72 and connected directly to transmitter circuitry 74. The voice signal information would then be transmitted through antenna 75 in a normal manner.

FIG. 3 has shown the interconnection of the digital frequency synthesizer system of the present invention connected to known receiver and transmitter circuitry thus providing the complete transceiver embodiment for the present invention. Prior art methods show combining phase locked loops through frequency mixers to obtain final tuning frequencies. This is done to provide coarse and fine tuning but can cause many subsequent filtering problems due to the production of spurious signals. These problems are eliminated for the preferred embodiment. The output of the digital frequency synthesizer of the present invention is coupled to provide a reference frequency source for the transmitter phase locked loop. Thus no spurious signals due to mixing are produced.

Figure 4:
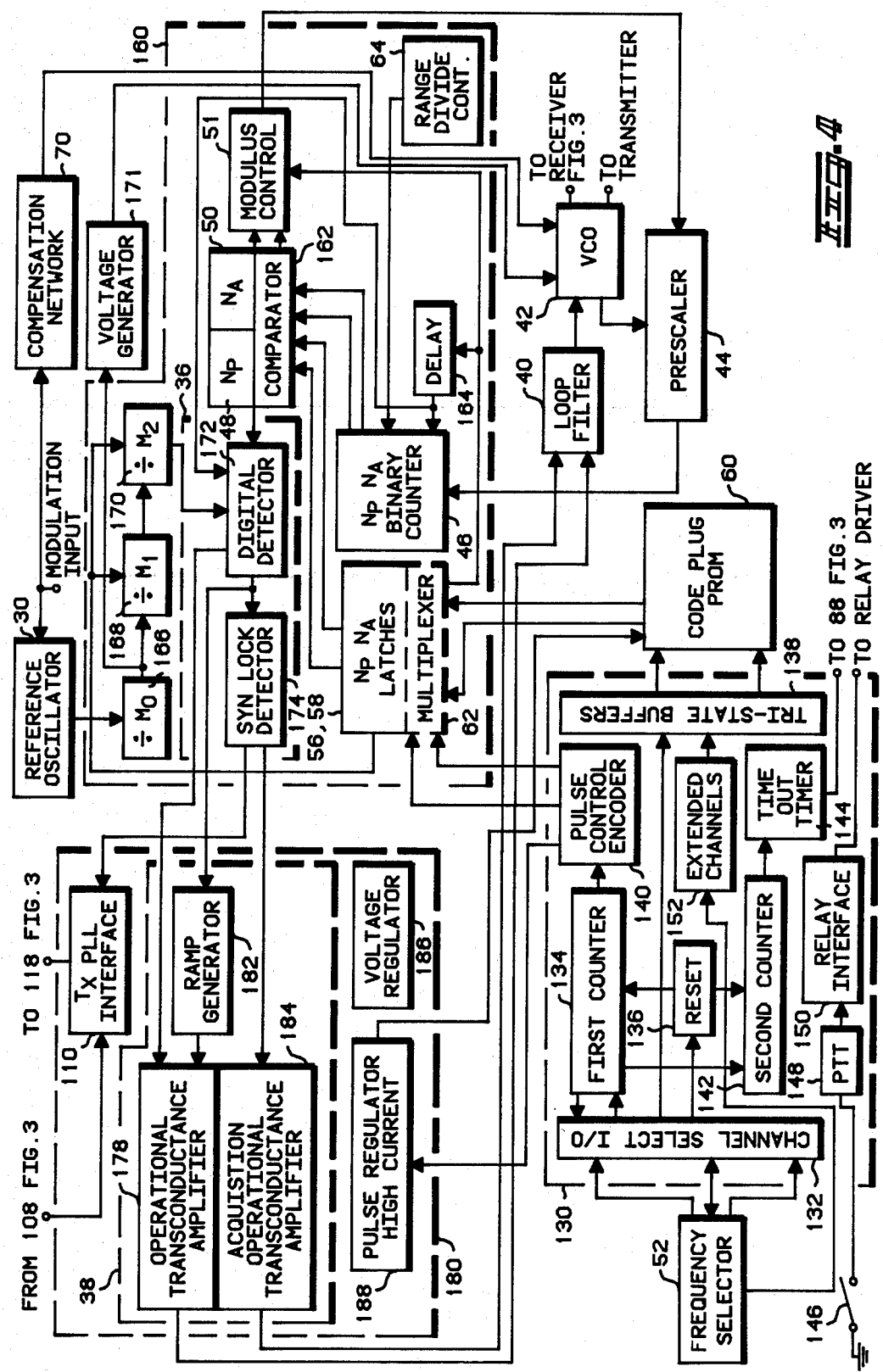
FIG. 4 is a detailed functional block diagram of the frequency synthesizer system of the present invention including the subdivision of the several functions onto several integrated circuits.

FIG. 4 shows a more detailed functional block diagram of the digital frequency synthesizer of the present invention emphasizing the arrangement of the various functional blocks onto several distinct integrated circuits which are shown enclosed by broken lines. In particular, frequency selector 52 is shown interconnected with an integrated circuit 130 which includes several interconnected functional blocks. A channel select input/output circuit 132 is interconnected with a first counter 134. Channel select I/O 132 also interconnects a reset circuit 136 and tristate buffers 138. An output of first counter 134 is coupled to a pulse control encoder 140. First counter 134 and reset 136 are each coupled to a second counter 142. The output of second counter 142 is coupled to a time-out timer 144 which has an output coupled to audio amplifier 88 in FIG. 3. A push-to-talk switch 146 is coupled to push-to-talk circuitry 148 which is coupled to a relay interface 150. The output of relay interface 150 is coupled to a relay driver circuit, which causes the actuation of antenna switch 76 as shown in FIG. 3. Also shown within integrated circuit 130 is an extended channels module 152 coupled to frequency selector 52 and tristate buffers 138. The output of tristate buffers 138 are directly connected to code plug PROM 60.

The inclusion of the several elements into integrated circuit 130 may be seen from the functional description to be closely related by their function within the operation of the digital frequency synthesizer. It is not imperative that they be located on the same integrated circuit, however, it has been found convenient to combine them appropriately.

The output of code plug PROM 60 is coupled to multiplexer 62 which is contained within a second integrated circuit 160 shown enclosed by a broken line. Multiplexer 62 is coupled to $N_P$ and $N_A$ latches 56 and 58 whose outputs are appropriately coupled to $N_P$ and $N_A$ comparators 48 and 50, respectively. Pulse control encoder 140 in IC 130 is coupled to multiplexer 62, and through multiplexer 62 to a delay circuit 164 contained within IC 160. Outputs from $N_P$ comparator 48 and $N_A$ comparator 50 are coupled to modulus control 51. An output from modulus control 51 is coupled back to prescaler 44. Integrated circuit 160 contains the digital frequency dividing and counting section of the digital frequency synthesizer and shows a more detailed description of the arrangement of the various components of the digital frequency synthesizer. As is the case for FIG. 2, the $N_P$ and $N_A$ binary counter 46 is coupled directly to $N_P$ and $N_A$ comparators 48 and 50 respectively. Delay circuit 164 is coupled to the $N_P$ and $N_A$ binary counter 46. This is the same single synchronous binary up counter as shown in FIG. 2.

Reference oscillator 30 is coupled to a sequence of three serially connected dividing circuits designated $M_0$, $M_1$ and $M_2$ which carry the corresponding referenced numerals 166, 168 and 170. An output of divider 166 is also coupled through a negative voltage generator 171 to VCO 42. The output of divider 170 is coupled to a digital detector 172 which is coupled to a synthesizer lock detector 174. Digital detector 172 and synthesizer lock detector 174 are shown enclosed by a broken line designated as 36 which corresponds to the digital section of the sample and hold phase detector 34 as shown in FIG. 2.

An output of $N_P$ comparator 48 is coupled to digital detector 172. An output from delay circuit 164 is coupled back to a second input of digital detector 172. Range divider control 64 is coupled to $N_A$ and $N_P$ divider 46. An output from $N_A$ latch 58 is coupled to dividers 168 and 170. Dividers 166, 168 and 170 function to serially divide the output signal from reference oscillator 30 to provide a programmed reference frequency to digital detector 172. An input signal designated modulation input is supplied to reference oscillator 30 and through compensation network 70 to VCO 42. This is the same signal path as in FIG. 3.

An output of digital detector 172 is connected to an operational transconductance amplifier 178 which is contained within a third integrated circuit 180 shown enclosed by a broken line. A second output from digital detector 172 is coupled to a ramp generator 182 also contained in integrated circuit 180. An output from synthesizer lock detector 174 is coupled to an acquisition operational transconductance amplifier 184 also contained within integrated circuit 180. A second output of synthesizer lock detector 174 is directly coupled to TX PLL interface 110. The TX PLL interface 110 also has an input signal from the transmitter lock detect circuit of FIG. 3 and provides an output to the transmitter RF gate 118 as shown in FIG. 3.

The combination of operational transconductance amplifier 178, acquisition OTA 184 and ramp generator 182 are shown additionally enclosed by a broken line designated 38 which corresponds to the analog section of the sample and hold phase detector 34. In addition, IC circuit 180 contains a voltage regulator circuit 186 which supplies regulated voltage to the several IC's and its many interconnections have been omitted to reduce the complexity. IC 180 further contains a pulse regulator high current circuit 188 which supplies power to PROM 60. Pulse regulator 188 also receives a signal from pulse control encoder 140 contained within integrated circuit 130.

The output of OTA 178 and acquisition OTA 184 are applied to loop filter 40. Loop filter 40, is coupled directly to VCO 42 which in turn provides output signals to the receiver and transmitter sections as shown in FIG. 3 and has an additional output supplied to prescaler 44. An output of prescaler 44 is coupled to the combination $N_P$ and $N_A$ counter 46 within integrated circuit 160.

The basic operation of the block diagram shown in FIG. 4 is the same as in FIG. 2. However, within each of the integrated circuits, additional detail is included for the function of the control and signal path within the several integrated circuits. Each of integrated circuits 130, 160 and 180 will be described in greater detail with additional block diagrams showing the group structure of the various circuit elements. FIG. 4 is intended rather than a detailed description of the individual function of the various integrated circuits to show the arrangement of the several functions constituting the digital frequency synthesizer into several integrated circuits, which are grouped by function. Thus, the digital counting and digital section of the sample and hold phase detector are all located on integrated circuit 160. The analog section of sample and hold phase detector 34 is located on integrated circuit 180 which further contains other analog circuitry to provide other analog functions. Thus, the segregation of the various submodules of the block diagram of FIG. 2 are implemented using different technologies combined with the grouping of similar functions within the digital frequency synthesizer system to optimize the design.

Similarly, the integrated circuit 130 contains all of the channel selection and debounce circuitry along with all of the operational control features of the digital frequency synthesizer system. It is convenient to include all of these on a single integrated circuit so that the various control monitoring functions can be grouped together for ease of manufacture and subsequent macroscopic analysis. Integrated circuit 130 is the detailed circuit implementation of channel select control 54 as shown in FIG. 3. The other modules shown in FIG. 4 are precisely the same functional blocks as shown in FIG. 2.

A more detailed description of a synthesized transceiver fully utilizing the present invention may be found in the specification and drawings of U.S. Pat. No. 4,441,098 to Borras et al. which will hereinafter be referred to as the Borras patent or simply Borras. The specification and drawings of this patent are hereby incorporated by reference as though disclosed fully herein. Common element numbers for elements of the drawings of the Borras patent have been retained in the discussion of the present invention.

The succeeding figures will each be described in greater detail for the operation of the circuits for the digital frequency synthesizer. FIG. 4 shows in one diagram, the basic interconnection of the rather complex circuits as described by their functional blocks and segregated onto several distinct integrated circuits.

Figure 5:
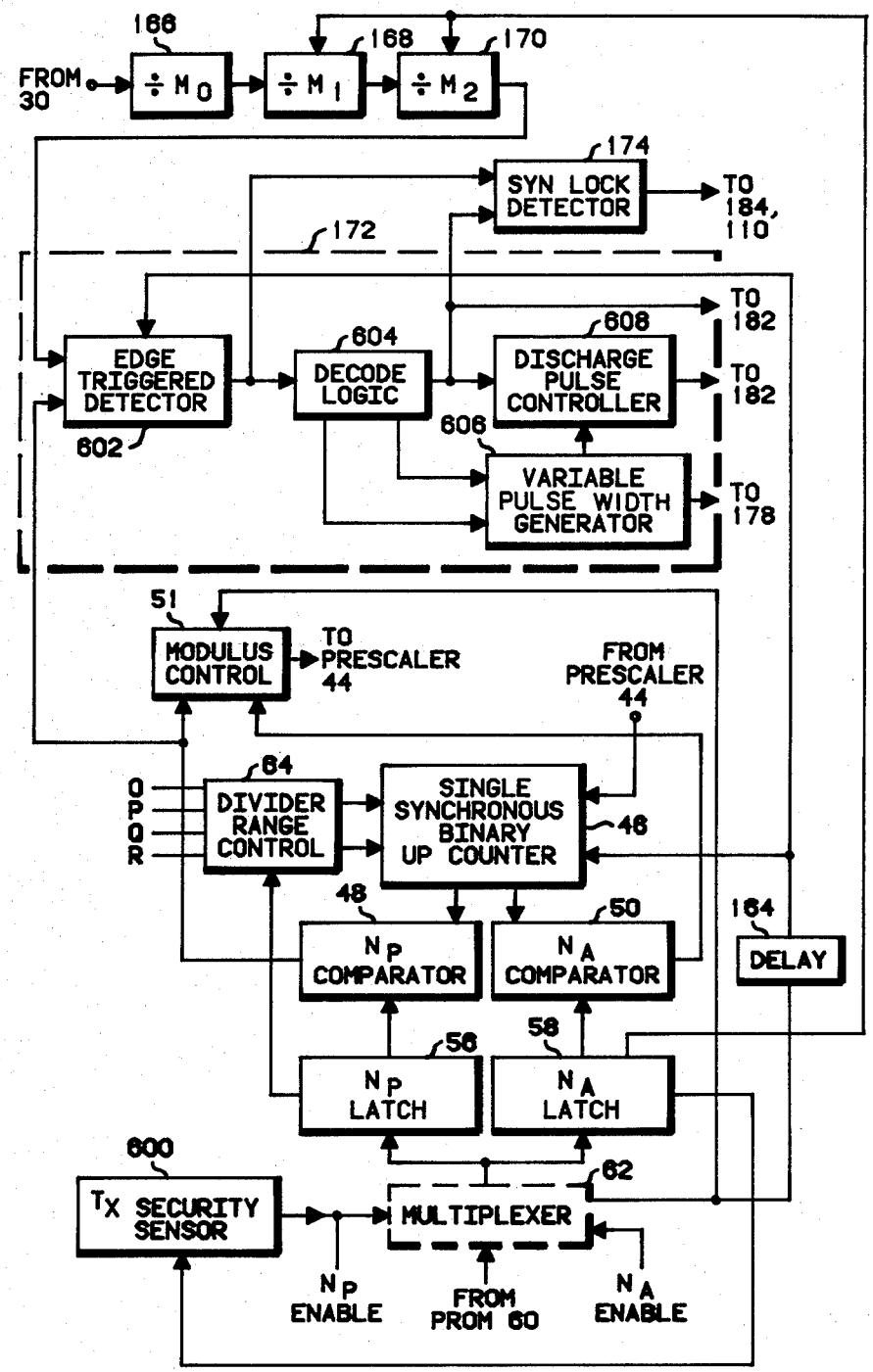
FIG. 5 is a detailed functional block diagram for the divisional portion and the phase detector for the frequency synthesis system of the present invention.

FIG. 5 is a detailed block diagram for integrated circuit 160. The outputs of PROM 60 are coupled to multiplexer 62 shown in phantom which in response to enable signals from pulse control encoder 140 (not shown) alternately supplies information to $N_P$ latch 56 and $N_A$ latch 58 (see FIG. 15 of the Borras patent). Multiplexer 52 represents the operation of transferring information from PROM 60 to the actuated latches and in reality there exists no block between PROM 60 and latches 56 and 58. $N_P$ latch 56 is coupled to range divider control 64 which is coupled to synchronous binary counter 46. Range divider control 64 receives 4 input signals designated O, P, Q and R. $N_P$ latch 56 is also coupled to $N_P$ comparator 48. An output from $N_A$ latch 58 is coupled to dividing circuits 168 and 170. $N_A$ latch 58 is also coupled to $N_A$ comparator 50. The output of prescaler 44 is supplied to a synchronous binary counter 46. Two signal outputs of counter 46 are applied to an $N_P$ comparator 48 and an $N_A$ comparator 50. An output of $N_P$ comparator 48 and an output of $N_A$ comparator 50 are coupled to a modulus control circuit 51. The output of modulus control circuit 51 is coupled to prescaler 44. The $N_P$ enable signal passes through multiplexer 62 and is coupled to delay circuit 164. The output of delay circuit is coupled to counter 46. $N_A$ latch 58 is coupled to a transmit security sensor 600 whose output is coupled with the $N_P$ enable signal and supplied to multiplexer 62.

The output of reference oscillator 30 is supplied to a series of dividing circuits 166, 168 and 170. The output of dividing circuit 170 is coupled as the first input of an edge triggered detector 602. The output of $N_P$ comparator 48 which is supplied to modulus control 51 is supplied as the second input of detector 602. The output of delay circuit 164 is coupled as the third input of detector 602. A first output of detector 602 is coupled to synthesizer lock detector 174 and a second output is coupled to a decode logic circuit 604. Decode logic circuit 604 supplies two output signals to a variable width pulse generator 606 which has one output coupled to a discharge pulse controller 608 and a second output coupled to ramp generator 182. Decode logic circuit 604 supplies the same output to synthesizer lock detector 174, ramp generator 182 and discharge pulse controller 608. The output of discharge pulse controller 608 is also coupled to ramp generator 182. Functional blocks 602, 604, 606 and 608 are shown enclosed by a broken line to comprise digital detector 172.

FIGS. 6 and 7 show detailed electrical schematics of portions of the present invention. In order to best understand their relationship with the operation of the entire transceiver system, reference should be made to the Borras Patent FIGS. 18 and 19. For purposes of the present discussion, only those particular circuits of interest are discussed.

Referring now to FIG. 7, delay circuit 164 is shown to comprise a series of logic signals which are suitably inverted and latched to provide a time delay for the operation of the digital portion of the frequency synthesizer. In particular, time delay 164 lengthens the initial pulse corresponding to the reset for the ten stages of counter 46 and enables an initialization in sample and hold phase detector 34 as will be more particularly described later.

In FIG. 6, digital detector 172 includes edge triggered detector 602 shown enclosed by a broken line. An output from reference divider $M_2$ designated 170 is applied to the clock input terminal of flip-flops 870 and 872. This input is also coupled through inverter 874 to the clock input terminals of flip-flops 872 and 870. Voltage VDD is applied to the data input terminal of flip-flop's 870 and 875. An output from counter 46, operating through NOR 808 in cooperation with an RS flip-flop in delay circuit 51 to provide wave shaping, is applied to the input of a pair of series connected inverters 876 and 878 to the clock input of flip-flop 875 and through an inverter 880 to the clock input of flip-flop 875. An output from an RS latch in delay circuit 164 is coupled to the set terminal of flip-flop 875. The clock terminal of flip-flop 875 is coupled as the first input of a NOR 884. The $\overline{Q}$ output of flip-flop 875 is coupled through a buffer gate 886 as the first input of a NOR 888 and a NAND 890, the first input of a NAND 892 and the second input of NOR 884. The $\overline{Q}$ output of flip-flop 870 is coupled as the second input of NOR 888 whose output is coupled to the reset terminals of flip-flop 870 and 875. The Q output terminal of flip-flop 870 is coupled as the second input of NAND 890 and as the third input of NOR 884. The Q output of flip-flop 872 is connected as the second input of NAND 892.

Edge triggered detector 602 comprises three flip-flops 870, 872 and 875 which are interconnected such that two of the flip-flops 870 and 872 are responsive to the $M_2$ reference divider circuit 170. The third flip-flop 875 is interconnected to an output of the single synchronous binary counter 46.

Decoding logic 604 is shown enclosed by a broken line. The output of NOR 884 is connected as the first input of a NOR 894 which is interconnected with a NOR 896 to form an RS flip-flop. The output of NAND 892 is connected as the first input of a NAND 898 and the output of NAND 890 is connected as the second input of NAND 898. The output of NAND 898 is connected through a pair of series connected inverters 900 and 902 as the first input of an AND gate 904. The Q output terminal from flip-flop 875 is connected as the second input of AND 904. The output of NAND 898 is also connected as the first input of a NOR gate 906 which is connected with a NOR gate 908 in the form of an RS flip-flop. The output of NAND 898 is also connected as the first input of a NOR 910 and as the second input of NOR 896.

The output of NAND 898 is also connected through a pair of series connected inverters 912 and 914 to ramp generator 182. These inverters are shown enclosed by a broken line and designated as part of decode logic 604.

Decoding logic 604 may be seen to comprise a series of logic gates interconnected to an RS flip-flop. The decoding logic acts on the output of the positive edge triggered flip-flops contained in edge triggered detectors 602 to determine a phase or frequency mode of operation for the digital sample and hold phase detector.

The phase mode is a condition for the digital phase detector in which the output signal from the voltage control oscillator through counter 46 and the signal from the last of the reference dividers 170 are at the same frequency. As has been described earlier, considering the digital waveforms conceptually phase mode then constitutes a condition in which the variable pulse from counter 46 is always interleved in one period of the divided down reference frequency from $M_2$ divider 170.

During the phase mode of operation the phase difference between the output of counter 46 and the reference frequency are compared and a ramp signal is generated whose final voltage will be proportional to the phase difference. In the event that the signal from the voltage control oscillator as counted in counter 46 tends to decrease, a ramp enable pulse will remain on for a longer time to make the correction for the error introduced. Similarly, the ramp enable pulse will be shorter if the VCO frequency operating through counter 46 momentarily increases. This operation will be described in greater detail later.

For the frequency mode of operation, the two input signals from the last $M_2$ divider 170 and the signal from VCO 42 operating through counter 46 are at different frequencies. The operation of this circuit in the frequency mode determines whether the VCO is lower or higher in frequency compared to the reference signal and causes a control voltage to be applied to the VCO to steer it in the proper direction so that the correspondence between the frequencies may be achieved. In this operation, the circuit functions much as an ordinary frequency detector.

In FIG. 6 variable pulse width generator 606 is shown enclosed by a broken line. The output of NOR 896 is connected as the first input of a NOR 916 and as the first input to NOR 918 which together with NOR 920 are connected in the form of an RS flip-flop. The Q output terminal of flip-flop 872 in edge triggered detector 602 is connected as the second input of NOR 916 and as the second input of NOR 918. The output of NOR 910 is connected as the third input of NOR 916 and through a series combination of inverters 922 and 924 to resistor and capacitor coupled to ground to provide a delay in the signal. This generates the sample pulse width and the delayed signal is connected through a protection circuit 926 and a series combination of inverters 928 and 930 back to the second input of NOR 908 contained in variable pulse width generator 606.

Variable pulse width generator 606 contains two logic gates in addition to a pair of NOR's connected as an RS flip-flop. The circuit operates to generate a sample pulse whose duration is variable depending upon external resistance and capacitive components. This sample pulse is applied to the OTA 178 as shown in FIG. 4 to transfer the ramp voltage to the loop filter and then onto voltage control oscillator 42 so that tuning may be achieved.

The output from reference divider 170 which was applied to flip-flops 870 and 872 is also applied through a series combination of inverters 932 and 934 to provide a signal back to another portion of delay circuit 164.

Synthesizer lock detector 174 is shown enclosed by a broken line. The output of NOR 920 which is connected with NOR 918 in the form of an RS flip-flop is also connected to the inputs of a parallel combination of inverters 936 and 938 whose outputs are commonly connected to an interconnection pad for integrated circuit 160. An external circuit comprising a parallel arrangement of a resistor and diode is connected to a capacitor coupled to ground and through a protection circuit 940. The external connection of the resistor, diode and capacitor to ground provides a spike filter for the operation of the synthesizer lock detector 174. The output of protection circuit 940 is connected to a series combination of inverters 942 and 944. The output of 944 is connected to the transmitter phase locked loop interface 110 (shown in FIG. 4). The output of inverter 944 is also connected to an inverter 946 whose output is connected to OTA 184 (shown in FIG. 4).

The RS flip-flop comprised of NOR's 918 and 920 with additional logic gates are shown in synthesizer lock detector 174. The function of the synthesizer lock detector 174 is to monitor the phase mode of the sample and hold detector and to indicate a locked condition during the phase mode. Thus, it gives an indication that proper tuning has been achieved by the digital frequency synthesizer. It may be observed that in the phase mode the synthesizer lock detector 174 will not produce an out of lock indication due to a minor slip in phase because the closed loop operation of the digital frequency synthesizer will compensate for the source of error. However, if the frequency mode is in operation the capacitor contained in the external spike filter will be discharged immediately thus indicating an out of lock condition for synthesizer lock detector 174.

Another portion of variable pulse width generator 606 is shown enclosed in the broken line. The output of NOR 916 is coupled through an inverter 950. The output of inverter 950 is supplied to OTA 178 as shown in FIG. 4.

Discharge pulse controller 608 is shown enclosed by a broken line in FIG. 6. The Q output from flip-flop 826 in $M_0$ divider 166 is applied through an inverter 952 to the clock terminal of flip-flops 954 and 956 and through an inverter 958 to the clock input terminals of flip-flops 954 and 956. The output of NOR 906 in variable pulse width generator 606 is connected to the data terminal of flip-flop 954 and through an inverter 960 to the reset terminals of flip-flops 954 and 956. The Q output terminal of flip-flop 954 is coupled to the D input terminal of flip-flop 956. The $\overline{Q}$ output terminal of flip-flop 956 is coupled through an inverter 962 to an output terminal which is supplied to ramp generator 182 as shown in FIG. 4.

Discharge pulse controller 608 functions to provide the logic to discharge the ramp capacitor in ramp generator 182 as will be more particularly described later. Controller 608 provides a digital delay which is dependent upon the reference oscillator frequency. This may be seen by the interconnection to the Q output of flip-flop 826 which is contained in $M_0$ divider 166. The delay is actuated after the sample pulse has been completed in order to decrease the reference signal feed through on the system. These features will be described in greater detail later. At that time, the detailed operation of the sample and hold phase detector which includes both digital and analog sections will be described.

FIG. 9 shows a combined block diagram and electrical schematic for the digital and analog sample and hold phase detector 34 for the frequency synthesizer. An input signal from the output of $M_2$ divider 170 is applied to the input of the digital section 36 of the sample and hold phase detector. The detailed circuit is shown in FIG. 6. An input from single synchronous binary counter 46 is applied as a second input to the digital section 36 of the sample and hold phase detector. An output from the decode logic circuit 604 is applied through a resistor 1030 to one input of ramp generator 182. An output from discharge pulse controller 608 is coupled through a resistor 1032 to a second input of ramp generator 182 which is coupled through a resistor 1034 to ground. $V_{DD}$ is supplied through a resistor 1036 to a third input of ramp generator 182.

The output of ramp generator 172 is coupled through a capacitor 1016 to ground and through a resistor 1038 to the noninverting input of OTA (operational Transconductance Amplifier) 178. Details of the nature and preferred circuitry for OTA 178 (and OTA 184) may be found in Borras. An output from variable pulse width generator 606 is coupled through a resistor 1040 to a control input of OTA 178 which is coupled through a resistor 1042 to ground. The output of OTA 178 is coupled through a capacitor 1022 to ground. Capacitor 1016 is the ramp capacitor for ramp generator 182 while capacitor 1022 is a hold capacitor which holds the VCO on frequency. The output of OTA 178 is coupled through unity gain buffer 1000 to provide an output to loop filter 40. The output of unity gain buffer 1000 is also coupled through resistor 1044 to the non-inverting input of acquisition OTA 184. The output of acquisition OTA 184 is supplied to loop filter 40 and is also interconnected to its inverting input terminal. An output from the synthesizer lock detector 174 is coupled through a resistor 1046 to a control input of acquisition OTA 184 and through a resistor 1048 to ground. The output of unity gain buffer 1000 is also connected through a resistor 1045 to the inverting input of OTA 178.

It will be recalled that the digital section 36 of the sample and hold phase detector 34 compares the digital pulses from the divided down reference frequency. This results in dividing the reference oscillator by $M_0$, $M_1$ and $M_2$ with the appropriate signal from single synchronous binary counter 46 which monitors the output of voltage control oscillator 42. The digital section of the phase detector as described earlier has two modes of operation. In the first mode it seeks to correct a frequency difference between the reference frequency and the counted VCO frequency. When these frequencies are equivalent, the digital section operates in a phase mode for its secondary mode of operation. The choice of this type of digital and analog phase detector was based on its ability to offer maximum reference signal attenuation along with precise tuning for the digital frequency synthesis system.

The operation of the digital and analog sections of sample and hold phase detector 34 may best be understood by referring to FIG. 10 which shows the waveforms for the digital and analog sections of the detector. In particular, the first waveform in FIG. 10, shows the output from the $M_2$ divider 170 which is supplied to sample and hold phase detector 34. The second waveform shows the output of single synchronous binary counter 46 operating through NOR 808. The third waveform shows the output of decode logic 604 and the fourth waveform shows the output of the variable pulse generator 606. The fifth waveform shows the output of discharge pulse controller 608, and the sixth waveform shows the output from the synthesizer lock detector which is applied to transmitter PLL interface 110. The seventh waveform shows the voltage as a function of time at junction 1020 which is at the output terminal of ramp generator 182 coupling to ramp capacitor 1016.

FIG. 10 shows the different modes of operation of the sample and hole phase detector. Time $t_0'$ is an arbitrary time where the VCO frequency momentarily increased after a normal phase mode period. This condition is chosen to demonstrate the full capability of the sample and hold phase detector. It may be observed that the waveform for $M_2$ divider 170 shows a repetitive pulse pattern throughout FIG. 10. In addition, between time $t_0'$ and time $t_4$ the output from single synchronous binary counter 46 operating through NOR 808 shows two pulses interleaved in a reference period defined by the waveform for $M_0$ divider 170. These pulse train configurations are indicative of the fact that the VCO frequency as determined through counter 46 is much higher than the reference frequency from divider 170. It may also be observed at a time somewhat after $t_0'$ that the leading edge of the output from variable pulse width generator 606 is shown to occur at the same time as the leading edge of the pulse from counter 46. The pulse output from variable pulse width generator 606 is now supplied to OTA 178 through resistor 1040 to transfer the ramp voltage to the loop filter and thus to steer the VCO to reduce the frequency.

It should be observed that during the time interval $t_0'$–$t_4$ junction 1020 has a low logic level signal which functions to reduce the control voltage supplied to the VCO and hence its frequency. The effect of this low logic level at junction 1020 may be observed in the waveform for the pulses from counter 46. It will be observed that the distance between the first five pulses for counter 46 as shown in FIG. 10 are decreasing in time which is indicative of the fact that the frequency of the VCO is being raised.

It may also be observed that during the time period immediately prior and including $t_4$ two reference pulses from $M_2$ divider 170 were received by the phase detector without a corresponding pulse being detected from counter 46. Therefore, at time $t_4$, at the leading edge of the second reference pulse from 170 without a corresponding pulse from counter 46, decode logic 604 generates a high logic level pulse which begins charging the ramp capacitor 1016. The effect may be observed as a ramp increase in voltage at junction 1020 as shown in the seventh waveform in FIG. 10. At time $t_5$ the first pulse from the VCO through counter 46 is detected thus terminating the signal from decode logic 604 and establishing the first sample pulse from variable width pulse generator 606. Also, at time $t_5$, the voltage at junction 1020 may be observed to begin a constant voltage level which is indicative of maintaining capacitor 1016 without additional charge.

At time $t_6$, the sample pulse from variable pulse width generator 606 terminates and this is shown to correspond to an intermediate level of the constant voltage on the ramp capacitor as shown for the waveform for junction 1020. At time $t_7$, the discharge pulse controller 608 produces a high logic level signal which corresponds to discharge of ramp capacitor 1016. This is observed as a pulse termination of the voltage at junction 1020 on its corresponding waveform. The time interval between $t_6$ and $t_7$ is a digital delay built into the digital phase detector by discharge pulse controller 608 which is dependent ultimately upon the reference frequency as indicated by $M_0$ divider 166. The purpose of this delay is to minimize the amount of reference frequency feedthrough which can reach the loop filter.

At time $t_8$, which is determined by the leading edge of the reference frequency pulse received from $M_2$ divider 170, we begin looking for the corresponding pulse from the VCO operating through single synchronous binary counter 46. The arrival of the leading edge of the reference pulse from $M_2$ divider 170 coincides with the production of the ramp enable signal from decode logic 604 and the termination of the output of discharge pulse controller 608. At this time, due to the ramp enable signal, as may be seen from the voltage waveform for junction 1020, the voltage is increased until it encounters a divided VCO frequency pulse. If no VCO frequency pulse from counter 46 is detected during this time interval, the ramp is increased to a maximum level and remains on until the next timing event. At time $t_9$, the leading edge of the next reference frequency pulse of divider 170 establishes the leading edge of a sample pulse from variable pulse width generator 606 which transfers to the VCO the voltage waveform for junction 1020 at its maximum level.

It should be observed that during the time interval $t_0'$–$t_8$, the VCO frequency was greatly reduced so that it could more properly correspond to the reference frequency from $M_2$ divider 170. Between timing intervals $t_9$ and $t_{10}$ the first pulse from counter 46, which is indicative of the VCO frequency, is detected between occurrences of a reference frequency pulse. It is during this period that the ramp generator will apply a suitable correcting voltage to the VCO through the OTAs which operates through the loop filter 40 to bring the frequency of the voltage control oscillator into correspondence with that of the reference frequency signal from $M_2$ divider 170. The interval $t_0$–$t_{10}$ corresponds to the frequency mode.

At time $t_{10}$, which is determined by the leading edge of pulse from reference divider 170, the sample pulse from variable pulse width generator 606 is terminated, and it may be seen from the voltage waveform for junction 1020 that this corresponds to a continuance of the signal applied to ramp capacitor 1016.

During the interval time $t_{10}$–$t_{11}$, the detection of the pulse from the voltage control oscillator operating through counter 46 triggers the termination of the pulse from decode logic 604 and the initiation of a sample pulse from variable pulse width generator 606. The purpose of this is to sample the voltage as shown by the waveform for junction 1020 to begin the process of bringing the VCO frequency into phase with the reference frequency from $M_2$ divider 170. It may also be observed that the waveform from discharge pulse controller 608 shows a relatively short period pulse to cause discharging of the ramp capacitor 1016.

After time $t_{11}$ since the VCO pulse as detected through counter 46 is now interleved between two reference pulses from $M_2$ divider 170 the sample and hold phase detector now enters its phase mode of operation. The waveforms during the interval just previous to $t_{10}$ and after $t_{11}$ are indicative of the fact that the frequency of the VCO starts approaching the frequency of the reference frequency from $M_2$ divider 170.

During time interval $t_{11}$–$t_{12}$, observing the waveform from decode logic 604, the pulse shown is proportional to the phase difference between the reference signal from $M_2$ divider 170 and the detected VCO pulse from counter 46. This may be seen in the waveform for junction 1020 as the period during which a ramp up signal is applied to ramp capacitor 1016. The DC level on the signal for junction 1020 at time $t_{12}$ will be proportional to the phase difference between the two input signals.

During the time interval $t_{12}$–$t_{13}$, the DC level which exists at junction 1020 is sampled by means of the pulse produced by variable pulse width generator 606. The DC level is transferred to the operational transconductance amplifier and supplied to loop filter 40 for application to the voltage control oscillator. During the time period between $t_{13}$ and $t_{14}$ is, again, a repeat of the time delay to minimize the feed through of the reference frequency into the loop filter 40. This time delay is similar to the time delay which is built into the system and as shown earlier between $t_6$ and $t_7$.

At $t_{14}$, the discharge pulse controller 608 waveform leading edge corresponds to the discharge of the voltage at junction 1020 which is indicative of discharging the ramp capacitor 1016. During this time and to the end of the diagram the sample and hold phase detector is in regular phase mode operation.

The phase detector continues to monitor in a phase mode any phase difference between the reference signal and the VCO signal. During this interval, the ramp is applied up to a voltage level which corresponds to the detected phase difference. By this means, the sample and hold phase detector can steer the VCO to maintain the correct phase relationship between the input signals. Thus, the phase detector is operating in a manner that is similar to prior art phase detectors in that the phase between two signals is detected and the voltage control oscillator is adjusted so as to maintain the relationship in phase.

At time $t_{15}$, it should be observed that the waveform for the synthesizer lock detector 174 goes to a high level indicating that both the frequency and phase have been detected and locked. This takes more than one sample of detection of the phase mode due to the time delay built into the operation of the spike filter circuit connected to synthesizer lock detector 174 as described in FIG. 18C of the Borras patent.

Considering now the overall operation of the digital and analog portions of phase detector 34 it will be seen that the digital portion operates in one of two possible modes to first determine the difference in frequency between the reference signal and the VCO signal and when the frequencies are brought into equality to switch to a phase operation so that the VCO may be controlled to any detected phase difference.

One feature of the digital and analog sample and hold phase detector is that it operates to minimize the noise output if any random microphonic signals are encountered. Because the preferred embodiment is a portable unit it is subject to rapid motion and shock and vibration and it is imperative that the digital frequency synthesizer be insensitive to such conditions. Moreover, the voltage change or slew rate of the ramp capacitor for the digital phase detector is adjusted to obtain an optimum gain in order to reach the desired frequency in optimum time. This is designed so that the sample and hold digital and analog phase detector will lock to a frequency in a very fast or minimum time. This feature cooperates with the operation of the loop filter as will be described in greater detail later to allow fast lock.

In addition, the operation of the analog section of the sample and hold phase detector is such that the operational transconductance amplifier provides one current output which corresponds to the normal phase operation while the acquisition operational transconductance amplifier provides a much greater current output to provide minimum acquisition time during a frequency change. At the time that both the frequency and phase have been detected and locked, the operation of the acquisition OTA is terminated while the OTA 178 continues to update the VCO frequency while in the phase mode. Thus the digital sample and hold phase detector provides digital sampling in both a frequency and phase modes and provides appropriate analog signal to drive the voltage control oscillator through the loop filter to the correct frequency in a minimum time. In addition, the operating characteristics of both the OTA and the acquisition OTA change the loop filter configuration so that the amount of filtering encountered during the acquisition mode of the loop is minimized. Thus, not only is the acquisition OTA capable of producing a much greater current but the path through which it operates namely the loop filter in contact with the VCO is reconfigured so that the greater current capability of the acquisition OTA may cause tuning at a faster rate. Subsequently, when operational transconductance amplifier 178 becomes dominant during the phase mode the loop filter as will be described in greater detail provides the appropriate filtering to prevent the passage of spurious and other signals into the voltage control oscillator.

When a frequency change condition occurs delay circuit 164 in IC 160 is triggered via the timing pulse from pulse encoder 140 in IC 130. Delay circuit 164 resets the single synchronous binary counter 46; the reference dividers 168, 170; and sets flip-flop 875 in digital phase detector 172. The length of the delay is determined by the external resistive and capacitive components shown in FIG. 7 as part of delay 164.

The output of RS flip-flop at node 816 in delay circuit 164 goes to a high logic level, it establishes the frequency mode with the simulated condition for which the VCO frequency is higher than the reference signal. Thus, the output of variable pulse width generator 606 and the discharge pulse controller 608 produced a high logic level signal. This sequence corresponds to the complete discharge of the hold capacitor voltage by sampling continuously the zero potential at junction 1020.

At the termination of the timing delay of delay circuit 164, both the reference dividers 168 and 170, and the single synchronous binary counter 46 begin their dividing operations. The Q output of the data flip-flop in delay circuit 164 goes to a high logic level to clock data flip-flop 870 and 872 of edge trigger detector 602. The Q output of the data flip-flop in delay circuit 164 also propagates through inverters 932 and 934, and two additional inverters to reset itself. This sequence resets the digital section of the phase detector to begin searching for the phase mode.

Since the VCO frequency will be lower than the reference signal, the first pulse that the phase detector can detect is one from $M_0$ divider 170 which sets up a condition similar to that shown for time $t_4$ in FIG. 10. In operation, this means that the phase detector has been forced to start in the phase mode so that if the phase detector has optimum gain, a lock condition could be achieved during the first few samples. This is achieved by always driving the VCO to its lowest frequency upon a frequency change and thus tuning is always from the same initial frequency and thus improve acquisition time.

Figure 11:
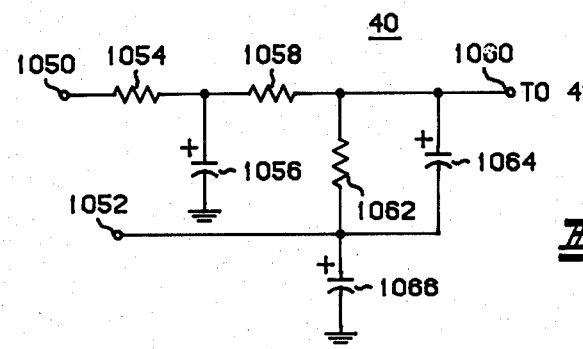
FIG. 11 is an electrical schematic of the loop filter circuit for the frequency synthesizer invention.

FIG. 11 shows the detailed electrical schematic for loop filter 40 as shown in FIGS. 2 and 4. The output terminal carrying the signal from OTA 178 and designated 1050 is coupled through a resistor 1054 in series with a capacitor 1056 to ground. Resistor 1054 is also connected through a resistor 1058 to the output terminal 1060 of loop filter 40. Resistor 1058 is also connected through a resistor 1062 to input terminal 1052 which corresponds to the output terminal of acquisition OTA 184. Output terminal 1060 is also connected through a capacitor 1064 in parallel to resistor 1062 to input terminal 1052. Terminal 1052 is also connected through a capacitor 1066 to ground.

Loop filter 40 is a low pass filter whose function is to provide relative stability for the loop and filtering between the output of the sample and hold digital and analog phase detector and voltage controlled oscillator 42. A principle function is to prevent reference frequency signals and harmonics coming from any of the variable frequency dividers 166, 168 or 170 from passing through and adversely affecting the control of voltage control oscillator 42. A secondary feature of loop filter 40 is to provide a filtering operation to prevent the passage of spurious and low frequency signals from reaching the voltage control oscillator to achieve good FM hum and noise performance.

Because of the presence in the preferred embodiment of different multipliers for the injection frequency in both the receive and transmit sections of the transceiver, it is necessary that we use a low reference frequency for comparison. Because of the presence of possible spurious signals related to the reference signal frequency and the fact that there would ordinarily be no protection in the audio circuits against them, the loop filter of necessity requires a very narrow bandwidth to insure that these frequencies will not pass to either disrupt the operation of the VCO or other parameters of the system. The combination of resistor 1054 and capacitor 1056 provides the additional attenuation required to prevent the passage of spurious frequencies derived from the reference frequency into the voltage controlled oscillator. The remaining four components, resistors 1058, 1062 and capacitors 1064 and 1066 constitute a low-pass filter which provide the proper stability for the operation of the phase locked loop.

It should be observed that input/output terminal 1050 which predominantly carries the output signal from OTA 178 is applied through both filter sections while the output of acquisition OTA 184 is applied at terminal 1052 which bypasses most of the resistive elements and operates through resistor 1062 which connects with output terminal 1060 to provide the unattenuated signal to VCO 42. This means that the output of acquisition OTA 184 can be supplied to the voltage controlled oscillator 42 to cause rapid advancement to have the frequency of the voltage controlled oscillator correspond to that of the reference frequency.

To summarize the operation of the phase detector (with reference to FIGS. 9, 10 and 11) the reference signal from 170 and the VCO signal from 46 are applied to the phase detector as shown in FIG. 9. The frequencies of the two signals are compared and if the frequencies are different, OTA 184 is enabled by the signal from 174. This causes the voltage present on capacitor 1022 to be applied directly to 1052 thereby bypassing a portion of the loop filter and rapidly bringing the VCO to the correct frequency.

When the correct frequency is reached, OTA 184 is deactivated and the phase detector looks for differences in phase between the VCO signal and the reference. The ramp generator then begins generating positive voltage ramps starting at its lowest voltage level. These voltage ramps are related to the phase difference in the two signals. This ramp voltage is sampled after the start of each pulse from the VCO signal and the sampled voltage delivered to capacitor 1022. This voltage is in turn delivered to the VCO by OTA 178 and buffer 1000 through the entire loop filter in order to maintain phase and frequency correction.

While a specific embodiment of this invention has been shown and described, further modifications and improvements will occur to those skilled in the art. All modifications which retain the basic underlying principles and claimed herein are within the scope of this invention.

What is claimed is:

1. A sample and hold phase detector for the phase locked loop portion of a frequency synthesizer capable of being switched to generate any one of a plurality of frequencies, said detector receiving a reference frequency signal and a voltage controlled oscillator signal, said voltage controlled oscillator signal being derived from a voltage controlled oscillator, said phase detector including both analog and digital portions which together generate a detector output voltage signal having a range of voltage values and which are coupled through a loop filter to the voltage controlled oscillator, said phase detector comprising:

digital detecting means for detecting both the frequency and phase difference between said reference frequency signal and said voltage controlled oscillator signal, said digital detecting means being operative in a first mode to generate a first control signal when said reference frequency signal and said voltage controlled oscillator signal exhibit a difference in frequency, said first control signal including information related to said difference in frequency, and being operative in a second mode when the frequencies of said reference frequency signal and said voltage controlled oscillator signal are substantially equal to periodically detect the phase difference therebetween and to generate a second control signal including information related to the difference in phase therebetween, said digital detecting means further producing a discharge signal when operating in said first mode and said voltage controlled oscillator signal is higher in frequency than said reference frequency signal, said digital detecting means also producing said discharge signal when operating in said second mode following detection of said phase difference;

energy storing means, coupled to said digital detecting means, for storing said first control signal when said digital detecting means is operating in said first mode, and for storing said second control signal when said digital detecting means is operating in said second mode;

discharging means, operatively coupled to said energy storing means and responsive to said discharge signal, for substantially completely discharging said energy storing means in response thereto;

first current amplifier means, coupled to said digital detecting means to be responsive to said first control signal, the output of said first current amplifier means being connected to bypass a portion of said loop filter whenever said digital detecting means enters said first mode, to supply voltage to said voltage controlled oscillator to rapidly tune said voltage controlled oscillator to a desired frequency; and second current amplifier means, having an input operatively coupled to said energy storing means and responsive to the first or second control signal stored therein, said second current amplifier being adapted to be coupled via said loop filter to said voltage controlled oscillator, for maintaining said voltage controlled oscillator at a desired tuning position when said digital detecting means is operating in said second mode.

2. The phase detector of claim 1, wherein said digital detecting means further includes ramp generating means, responsive to said phase difference and said frequency difference for generating said first and second control signals.

3. The phase detector of claim 2, wherein said second control signal includes a voltage ramp signal.

4. The phase detector of claim 3, wherein said ramp generating means further includes means responsive to selection of a frequency for forcing said first signal to its lowest voltage value and then causing a positive voltage ramp for use in tuning said voltage controlled oscillator.

5. The phase detector of claim 1, wherein said energy storing means includes a capacitor.

* * * * *